United States Patent
Hiramatsu et al.

(10) Patent No.: US 6,809,299 B2
(45) Date of Patent: Oct. 26, 2004

(54) HOT PLATE FOR SEMICONDUCTOR MANUFACTURE AND TESTING

(75) Inventors: Yasuji Hiramatsu, Gifu (JP); Yasutaka Ito, Gifu (JP)

(73) Assignee: Ibiden Co., Ltd., Ogaki (JP)

(*) Notice: Subject to any disclaimer, the term of this patent is extended or adjusted under 35 U.S.C. 154(b) by 0 days.

(21) Appl. No.: 10/069,510

(22) PCT Filed: Jul. 4, 2001

(86) PCT No.: PCT/JP01/05791
§ 371 (c)(1),
(2), (4) Date: Jun. 20, 2002

(87) PCT Pub. No.: WO02/03435
PCT Pub. Date: Jan. 10, 2002

(65) Prior Publication Data
US 2003/0038129 A1 Feb. 27, 2003

(30) Foreign Application Priority Data
Jul. 4, 2000 (JP) ........................................ 2000-202510

(51) Int. Cl.[7] .............................................. H05B 3/68
(52) U.S. Cl. ................................ 219/444.1; 219/443.1; 219/445.1; 219/446.1; 219/448.11; 219/448.12; 219/450.1
(58) Field of Search .................... 219/444.1, 443.1, 219/445.1, 446.1, 448.11, 448.12, 448.17, 450.1, 451.1

(56) References Cited
U.S. PATENT DOCUMENTS

| | | | |
|---|---|---|---|
| 5,665,260 A | 9/1997 | Kawada et al. | |
| 5,800,618 A | * 9/1998 | Niori et al. | ............... 118/723 |
| 5,998,321 A | 12/1999 | Katsuda et al. | |
| 6,080,970 A | 6/2000 | Yoshida et al. | |
| 6,465,763 B1 | 10/2002 | Ito et al. | |
| 6,475,606 B2 | 11/2002 | Niwa | |
| 6,507,006 B1 | 1/2003 | Hiramatsu et al. | |
| 6,677,557 B2 | 1/2004 | Ito et al. | |
| 2002/0043527 A1 | 4/2002 | Ito | |
| 2003/0015521 A1 | 1/2003 | Ito | |

FOREIGN PATENT DOCUMENTS

| | | |
|---|---|---|
| JP | 7-221168 | 8/1995 |
| JP | 10-189695 | 7/1998 |
| JP | 11-100270 | 4/1999 |

* cited by examiner

Primary Examiner—Shawntina Fuqua
(74) Attorney, Agent, or Firm—Oblon, Spivak, McClelland, Maier & Neustadt, P.C.

(57) ABSTRACT

A hot plate for a semiconductor producing/examining device, in which hot plate, when an object to be heated such as a silicon wafer is heated in a state that the object is distanced by a certain distance from the heating face, air is less likely to stagnate between the silicon wafer and the heating face and thus the object to be heated can be evenly heated. Specifically, the hot plate for a semiconductor producing/examining device includes a resistance heating element formed on a surface of a ceramic substrate or inside the ceramic substrate, wherein the glossiness of the heating face of the ceramic substrate is 1.5% or more.

14 Claims, 7 Drawing Sheets

(a)

(b)

(c)

(d)

(a)

(b)

(c)

(d)

(a)

Ra=0.1 μm (b)

Ra=0.1 μm (c)

Ra=0.1 μm (d)

Ra=0.1 μm

15kV ×5000  1 μm

15kV ×5000  1 μm

HOT PLATE FOR SEMICONDUCTOR MANUFACTURE AND TESTING

TECHNICAL FIELD

The present invention relates to a hot plate for a semiconductor producing/examining device mainly used in the semiconductor industry.

BACKGROUND ART

In a semiconductor production/examining device and the like such as a device for etching and a device for CVD, there has conventionally been used a heater, a wafer prober and the like in which a base material made of metal such as stainless steel, aluminum alloy is used.

However, such a conventional heater made of metal as describe above has following defects.

First, the plate thickness of such a heater made of metal must be relatively large (15 mm or so), because a metal plate, if the plate thickness thereof is not large enough, generates warp, strain and the like due to the thermal expansion caused by heating, thereby causing breakage or tilting of a silicon wafer set on the metal plate. When the heater plate is made too thick, however, the heater becomes too heavy and bulky, which is also problematic.

In a heater made of metal, the temperature of a face on which an object to be heated such as a silicon wafer is heated (which face will be referred to as a heating face hereinafter) is controlled by changing the magnitude of voltage/electric current applied to a resistance heating element. When the metal plate as a heater is thick as described above, the temperature of the heater plate fails to promptly follow the change in the voltage and/or electric current. In short, temperature controlling cannot be easily performed in a heater made of metal.

In order to overcome such problems as described above, JP Kokai Hei 11-40330 proposes a ceramic substrate (a hot plate) in which a nitride ceramic or a carbide ceramic having high heat conductivity and strength is used as a substrate and a resistance heating element is provided on a surface of the plate-formed body made of such a ceramic by baking metal particles on the substrate surface by sintering.

In a hot plate comprising nitride ceramic and the like as described above, a through hole is generally arranged in a ceramic substrate thereof and a lifter pin (a pin for supporting a silicon wafer and the like) is inserted through the through hole. The object to be heated such as a silicon wafer is supported by the lifer pin and heated in a state that the object to be heated is distanced by the length of 50 to 2000 μm from the heating face of the substrate.

When the object to be heated is heated in such manner by the above-mentioned hot plate, generation of warp, strain and the like is less likely to happen even at a high temperature because the hot plate has higher strength due to the use of ceramic, as compared with a hot plate made of metal. Further, the above-mentioned hot plate made of nitride ceramic and the like exhibits relatively excellent temperature following property to the change of the magnitude of voltage and/or electric current applied thereto.

However, a conventional ceramic substrate made of such a material exhibits relatively poor sintering property and relatively low density of the sintered product, and tends to contain pores therein (refer to JP Kokai Hei 5-8140).

In general, a surface of a ceramic substrate is ground so that the surface is made flat and smooth. However, in the case of a ceramic substrate having pores therein, a perfectly flat and smooth surface cannot be formed because the pores inside the substrate are constantly exposed at the surface even after the grinding. Thus, significant irregularities exist on the surface of a conventional ceramic substrate.

As a result, when an object to be heated is heated in a state that the object to be heated is distanced by a certain distance from the heating face of a substrate, air between the ceramic substrate and the object to be heated cannot flow as laminar flow in a stable manner at a constant rate but the air is divided into a plurality of portions in accordance with the pattern of the respective portion at which concave portions are formed at the ceramic substrate, whereby stagnation occurs in the each portions at which the concave portion is formed.

Further, since the distance between the object to be heated and heating face varies due to the above-mentioned reason, the quantity of heat reaching the object to be heated also varies depending on the portion, whereby the temperature distribution on the heating face is not directly reflected in the object to be heated. In short, in a conventional ceramic substrate, due to the reason as described above, the even distribution of temperature at the object to be heated is not achieved in a satisfactory manner.

SUMMARY OF THE INVENTION

The inventors of the present invention have discovered, as a result of a keen study for solving the above-mentioned problems, that incorporating oxygen in the ceramic which constitutes the substrate improves the sintering property of ceramic, whereby pores at a heating face of a hot plate can be substantially eliminated or at least the diameter of the pore can be significantly reduced. The inventors of the present invention have also discovered that such improvement of the sintering property realizes a dense structure of the ceramic substrate, in which grains are bound to each other by a strong binding force, whereby grains are prevented from falling off at the time of grinding and thus the glossiness of the heating face can be enhanced. The present invention has been completed on the basis of the aforementioned discoveries.

Specifically, the present invention provides a hot plate for a semiconductor producing/examining device, comprising a resistance heating element formed on a surface of a ceramic substrate or inside the ceramic substrate, wherein the glossiness of the heating face of above-mentioned ceramic substrate is 1.5% or more.

In the present invention, the above-mentioned ceramic substrate preferably comprises a non-oxide type ceramic which contains oxygen. This is because, by incorporating oxygen into a non-oxide type ceramic, the sintering property of the ceramic substrate is improved, whereby the glossiness thereof can be enhanced by the grinding process.

Further, the above-mentioned ceramic substrate preferably contains 0.5 to 10 weight % of oxygen. This is because, when the above-mentioned ceramic substrate contains 0.5 to 10 weight % of oxygen, the sintering property of the ceramic substrate is improved, whereby the glossiness of the ceramic substrate can be enhanced by the grinding process.

Yet further, the above-mentioned ceramic substrate is preferably subjected to an annealing treatment. This is because the shape of grains present on the surface of the ceramic substrate can be made round by effecting the annealing treatment to the ceramic substrate, whereby the glossiness of the above-mentioned ceramic substrate can be enhanced.

Yet further, the above-mentioned ceramic substrate is preferably subjected to the cold isostatic pressing process before it is sintered. This is because, pores can be completely eliminated from the formed body which has not been sintered yet by carrying out the cold isostatic pressing, whereby the glossiness of the ceramic substrate can be enhanced.

| Explanation of numerals | |
|---|---|
| 9 | Silicon wafer |
| 10, 20 | Hot plate |
| 11, 21 | Ceramic substrate |
| 12, 22 | Resistance heating element |
| 13, 23 | External terminal |
| 14, 24 | Bottomed hole |
| 15, 25 | Through hole |
| 16 | Lifter pin |
| 18 | Thermocouple |
| 27 | Blind hole |
| 28 | Conductor-filled through hole |
| 30 | Supporting case |
| 30a | Coolant outlet |
| 32 | Guide pipe |
| 35 | Heat insulator |
| 37 | Metal member for pressing |

| -continued | |
|---|---|
| Explanation of numerals | |
| 38 | Bolt |
| 39 | Coolant inlet pipe |
| 130 | Solder paste layer |
| 170 | Socket |

DETAILED DESCRIPTION OF INVENTION

A hot plate for a semiconductor producing/examining device of the present invention comprises a resistance heating element formed on a surface of a ceramic substrate or inside the ceramic substrate, wherein the glossiness of the heating face of said ceramic substrate is 1.5% or more.

In the case of the ceramic substrate having such glossiness as described above, when a silicon wafer is heated in a state that the silicon wafer is distanced by the length of 50 to 500 µm from the heating face of the hot plate for a semiconductor producing/examining device (which may be referred to as simply hot plate hereinafter), stagnation and the like of air is less likely to occur between the heating face and the object to be heated because the heating face is sufficiently flat, whereby the air flows as laminar flow at a constant flow rate. Further, as the distance between the object to be heated and the heating face is substantially constant allover the heating face, it is prevented that the quantity of heat reaching the heating face varies depending on the portion of the heating face. As a result, the object to be heated such as a silicon wafer and the like can be evenly heated.

Yet further, in a case that a silicon wafer is put directly on the heating face of the ceramic substrate, the contact between the silicon wafer and the heating face is effected as a perfectly continuous surface-contact, whereby the object to be heated such as a silicon wafer can be evenly heated.

Japanese Patent gazette No. 2513995 and other references disclose that it is possible to form a smooth surface having Ra (surface roughness) of 1 µm or less at the substrate. However, the Ra of the above-described references is the information of the depth of the irregularities on the substrate surface and does not prescribe the density of the irregularities at all. On the other hand, in the hot plate of the present invention, the density of the irregularities as well as the depth thereof, on the substrate surface is controlled, by referring to the glossiness as an idex, so that the hot plate can evenly heat the object to be heated.

In the present invention, the glossiness includes the information of not only the depth of the irregularities but also the density thereof.

Figure 7:
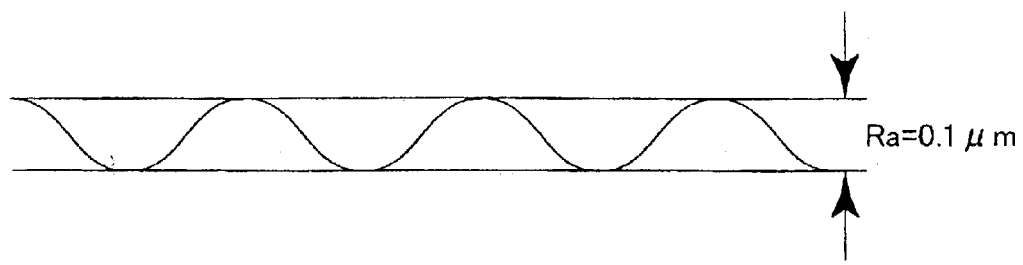
FIGS. 7(a) and 7(b) are explanatory views which explain the relationship between the glossiness and the average surface roughness Ra of the ceramic substrate.
FIGS. 7(c) and 7(d) are explanatory views which explain the relationship between the glossiness and the state of the surface of the ceramic substrate.
Figure 7:
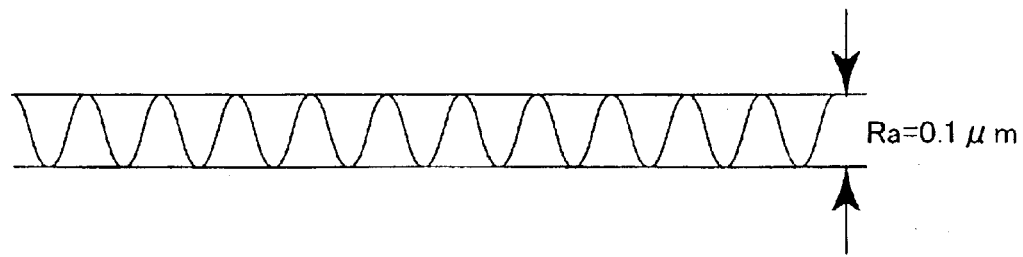
Figure 7:
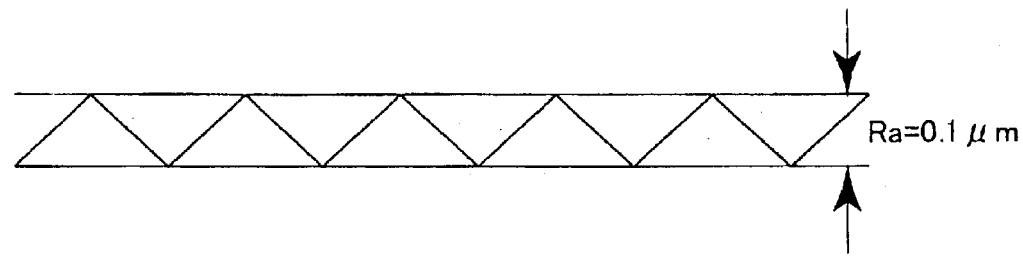
Figure 7:
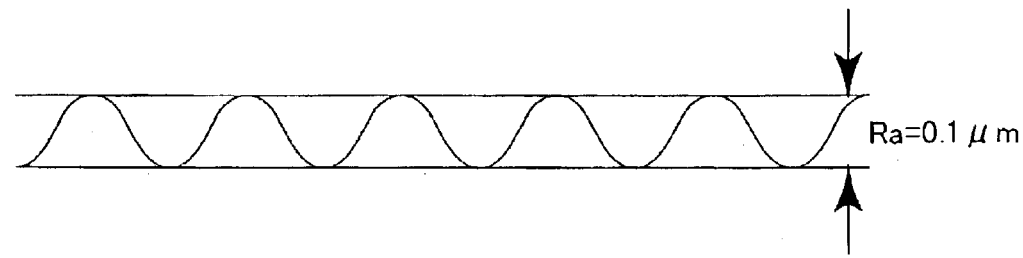

FIGS. 7(a) and 7(b) are explanatory views which explain the relationship between the glossiness and the average surface roughness Ra of the ceramic substrate. FIGS. 7(c) and 7(d) are explanatory views which explain the relationship between the glossiness and the state of the surface of the ceramic substrate.

Although Ra as the average surface roughness of the ceramic substrate is 0.1 µm in both FIGS. 7(a) and 7(b), the configuration shown in FIG. 7(a) exhibits a larger glossiness than the configuration shown in FIG. 7(b). This example demonstrates that Ra does not reflect the information of the density of the irregularities on the surface. That is, even when Ra as the surface roughness is increased, a sufficiently large glossiness can be expected if the density of the irregularities at the surface is significantly small.

Further, as is explained in FIGS. 7(c) and 7(d), the glossiness of the surface configuration of FIG. 7(c) having sharp irregularities is different from the glossiness of the surface configuration of FIG. 7(d) having round irregularities, even if Ra as the average surface roughness of the ceramic substrate is 0.1 μm in both FIGS. 7(c) and 7(d) and the density of the irregularities is also the same in the two configurations. In this case, the glossiness of FIG. 7(d) configuration is higher than that of FIG. 7(c) configuration. That is, the glossiness has the information of not only the density of the irregularities but also the information of the surface state of the roughened surface.

In the case of the inventions described in the above-mentioned references, in which no specific attempt is made to incorporate oxygen and the like into the ceramic substrate, concaved portions resulted from the portions which have not been sintered which is produced at the grain boundary and/or concaved portions produced because of particles which have fallen off, may be generated. If such concaved portions are present as a cluster at the ceramic surface, it is difficult to achieve the glossiness of 1.5% or more even in the case that there exists no pin hole.

The ceramic substrate according to the present invention exhibits excellent sintering property and has a sufficiently high density, whereby the diameter of pore present inside the substrate is significantly small and thus the ceramic substrate is formed dense as compared with that of the conventional one. Accordingly, the grains constituting the sintered body are firmly bound to each other, whereby the particles hardly come off by grinding and a sufficiently flat and smooth surface can formed. As a result, the glossiness of the substrate of 1.5% or more can be reliably achieved and the free particles are not generated.

Here, the glossiness of the ceramic substrate represents the glossiness measured by the method according to JIS K 7105 5.2 section (the method of testing optical properties of a plastic). The surface glossiness of ceramic can be measured by this method on the basis of the same principal, although the method is proposed for measuring the glossiness of plastic surface.

In the above-mentioned method, light is irradiated on the sample surface at the incidence angle of 60° so that the regular reflection components are measured by using a photoreceiver. A glass surface having refractive index of 1.567 is employed as the reference of the relative-specular glossiness. That is, the glossiness of the obtained data is evaluated with respect to glossiness of the above-mentioned reference as 100%.

Examples of the method of enhancing the glossiness include: a method of eliminating pore of the ceramic substrate and particles which fall off from the substrate; and a method of making the irregularities on the surface of the ceramic substrate round.

Examples of the above-mentioned method of eliminating pore and particles which fall off include: a method of firing nitride ceramic or carbide ceramic as the raw material in air, so that oxygen is introduced into the ceramic and the sintering property at the grain boundary is improved; a method of completely eliminating pore, by subjecting the formed body to cold isostatic pressing prior to the sintering; and the like. Examples of the method of making the irregularities at the ceramic surface round include: a method of making the irregularities at the ceramic surface round and gentle-slope by subjecting the sintered body to the annealing treatment; and the like.

Figure 8:
FIG. 8 is a SEM (scanning electron microscope) photo of the surface of the ceramic substrate prior to the annealing treatment.
Figure 9:
FIG. 9 is a SEM photo of the surface of the ceramic substrate after the annealing treatment.

Regarding the above-mentioned annealing treatment, FIG. 8 shows a SEM photograph of the ceramic substrate surface which has not been subjected to annealing and FIG. 9 shows a SEM photograph of the ceramic substrate surface which has been subjected to annealing. The sample of FIG. 9 which has been subjected to annealing exhibits higher glossiness of the ceramic substrate. Specifically, the sample shown in FIG. 8 exhibits glossiness of 1.1%, while the sample shown in FIG. 9 exhibits glossiness of 20%.

In the present invention, incorporation of oxygen into the ceramic contain, for example, results in a dense structure of the ceramic substrate in which grains thereof are firmly bound to each other. Accordingly, by subjecting a ceramic substrate having such a structure to the grinding process, a hot plate whose glossiness at the ceramic substrate surface is 1.5% or more can be realized.

Alternatively, the glossiness at the ceramic substrate surface can be set within the above-mentioned range by a method including the steps of: making the structure of a ceramic substrate dense by subjecting the formed body which is not yet sintered, during the production process thereof, to cold isostatic pressing (CIP); and then carrying out the sintering process of the ceramic substrate.

The method of incorporating oxygen into a ceramic substrate will be described later.

Further, by firing the above-mentioned ceramic substrate at 1400 to 1800° C. so that the grains at the above-mentioned ceramic substrate surface have round configurations, the irregularities at the ceramic substrate surface can be made smooth and gentle-slope, whereby the glossiness at the above-mentioned ceramic substrate surface can be improved.

Figure 1:
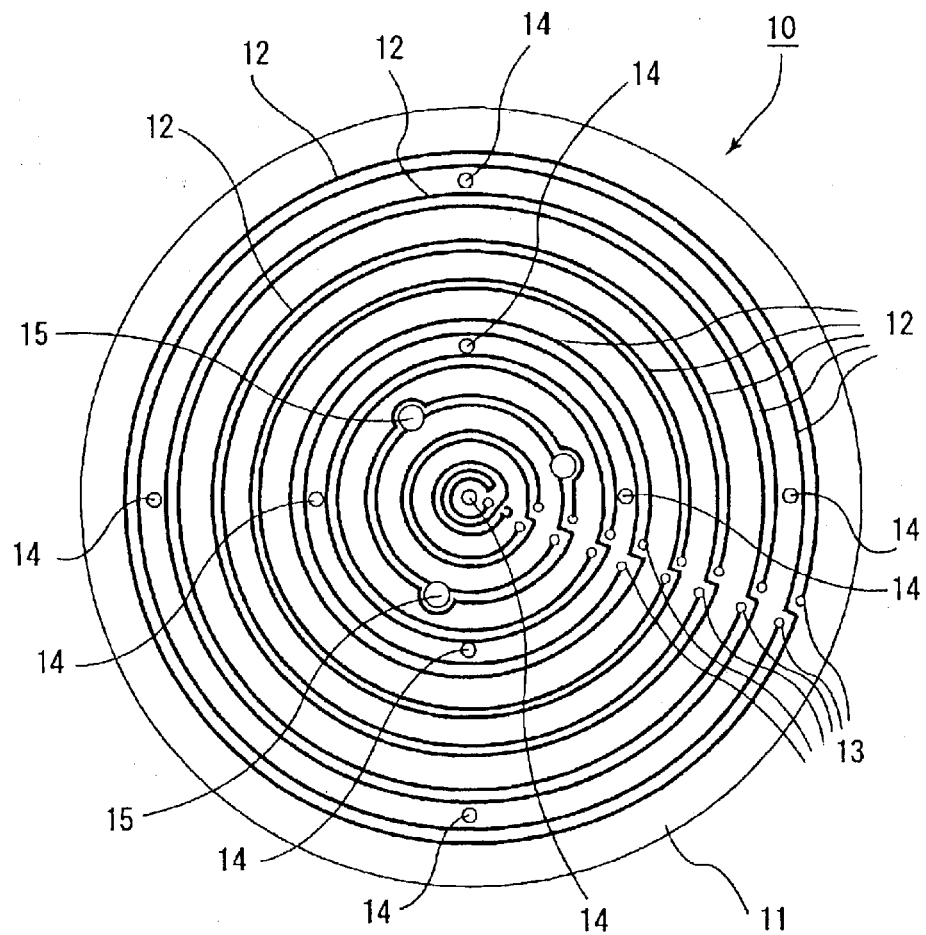
FIG. 1 is a bottom view which schematically shows one example of a hot plate for a semiconductor producing/ examining device of the present invention, in which hot plate a resistance heating element is formed on the bottom face thereof.
Figure 2:
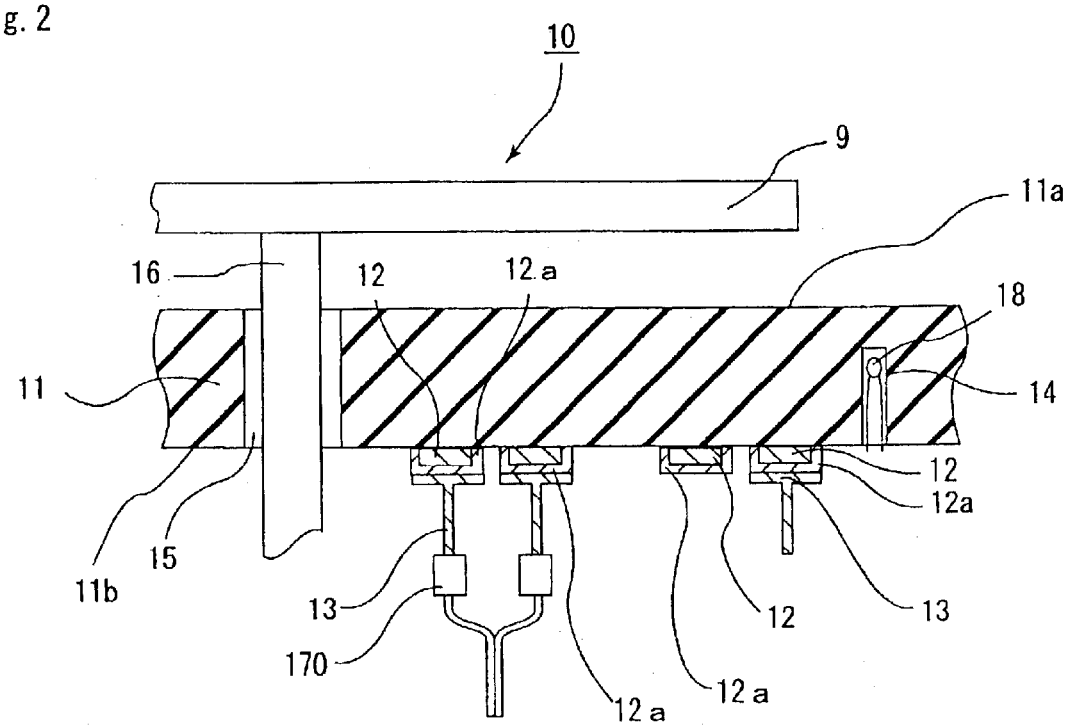
FIG. 2 is a partially-enlarged sectional view which schematically shows a portion of the hot plate for a semiconductor producing/examining device of FIG. 1.

FIG. 1 is a bottom view which schematically shows one example of a hot plate of the present invention. FIG. 2 is a partially-enlarged sectional view which schematically shows a portion of the hot plate of FIG. 1. In the hot plate of FIG. 1, a resistance heating element is formed on the bottom face of the ceramic substrate.

As shown in FIG. 1, the ceramic substrate 11 is formed so as to have a disc-like shape, and a plurality of resistance heating elements 12 are formed in a pattern of concentric circles on the bottom face 11b of the ceramic substrate 11. In the resistance heating element 12, each set of two concentric circles close to each other forms one continuous line as one circuit, and the combination of these circuit sets are designed so that the temperature distribution on the heating face 11a is made even.

Further, as shown in FIG. 2, a metal covering layer 12a is provided on each of the resistance heating elements 12, so that the resistance heating elements are prevented from being oxidized. An external terminal 13 is connected to each end portion of the resistance heating element 12 by using solder and the like (not shown). A socket 170 having wiring is connected to the external terminal 13, whereby the external terminal 13 is connected to a power source.

A bottomed hole 14 in which a temperature measuring element 18 is to be inserted is formed at the ceramic substrate 11. A temperature measuring element 18 such as a thermocouple and the like is embedded inside the bottomed hole 14. A through hole 15 through which a lifter pin 16 is to be inserted is formed at a portion near to the center of the ceramic substrate 11.

The lifter pin 16 is designed such that the lifter pin 16 can be moved in the vertical direction with carrying a silicon wafer 9 put thereon. By moving the lifter pin 16 in the vertical direction, the silicon wafer 9 can be transferred to a conveyer (not shown) or the silicon wafer 9 can be received from a conveyer. In addition, the silicon wafer 9 can be set on the heating face 11a of the ceramic substrate 11 so that the silicon wafer 9 is heated, or the silicon wafer 9 can be supported in a state that the silicon wafer 9 is distanced by the length of 50 to 2000 μm from the heating face 11a, so that the silicon wafer 9 can be heated.

Alternatively, it is acceptable that the silicon wafer 9 is heated in a state that the silicon wafer 9 is distanced by the length of 50 to 2000 μm from the heating face 11a, by: forming a through hole or a concave portion in the ceramic substrate 11; inserting a supporting pin having a tip end shaped in a form of pointing tower or semisphere into the through hole or the concave portion; fixedly holding the supporting pin in a state that the supporting pin is slightly projected from the ceramic substrate 11; and supporting the silicon wafer 9 by the supporting pin.

Figure 3:
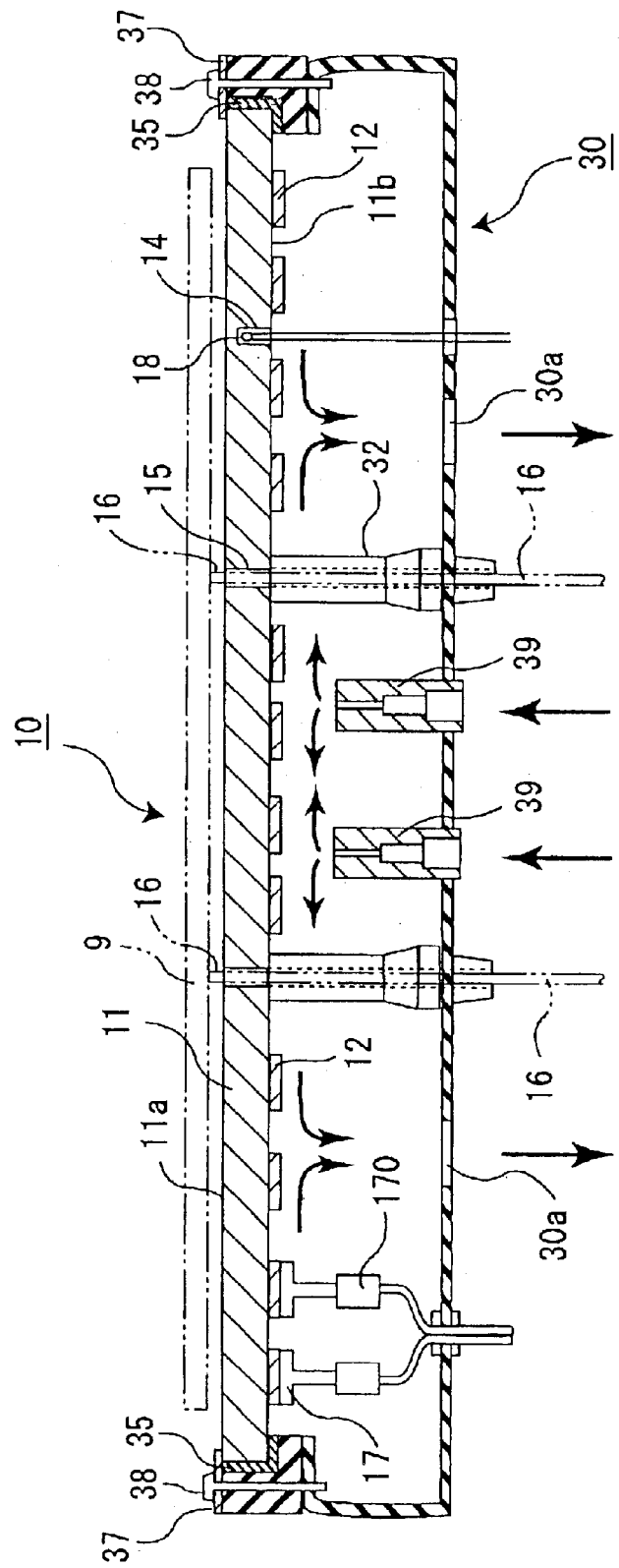
FIG. 3 is a sectional view which schematically shows a supporting case in which the hot plate for a semiconductor producing/examining device of FIG. 1 is arranged.

FIG. 3 is a sectional view which schematically shows a supporting case in which the ceramic substrate as describe above which constitutes a hot plate is arranged.

In a case that the ceramic substrate 11 is used in a state that the ceramic substrate 11 has been fitted in a supporting case as shown in FIG. 3, a guide pipe 32 is provided under the portion at which the through hole 15 has been formed, of the ceramic substrate 11, such that the guide pipe 32 communicates with the through hole 15. A lifter pin 16 is inserted through the through hole 15, whereby the silicon wafer 9 can be supported in a state that the silicon wafer 9 is distanced from the surface of the ceramic substrate 11.

Further, a coolant outlet 30a is formed in the supporting case 30 such that the coolant introduced from a coolant inlet pipe 39 is discharged outside through a coolant outlet 30a. By the action of the coolant, the ceramic substrate 11 can be cooled.

Accordingly, after activating the hot plate such that the hot plate 10 is heated and the temperature of the silicon wafer 9 is increased to a predetermined temperature, the ceramic substrate 11 can then be cooled by introducing the coolant from the coolant inlet pipe 39.

When the silicon wafer 9 is heated as shown in FIG. 3, by using the hot plate of the present invention whose glossiness on the heating face thereof is 1.5% or more, in a state that the silicon wafer 9 is distanced by a certain distance from the heating face 11a, the distance between the silicon wafer and the heating face is substantially constant all over the heating face because the heating face is excellently flat and smooth, whereby there exists no portion on the heating face at which portion air stagnates between the silicon wafer and the heating face. As a result, the air between the silicon wafer and the heating face flows as laminar flow and thus the silicon wafer 9 can be evenly heated.

Figure 4:
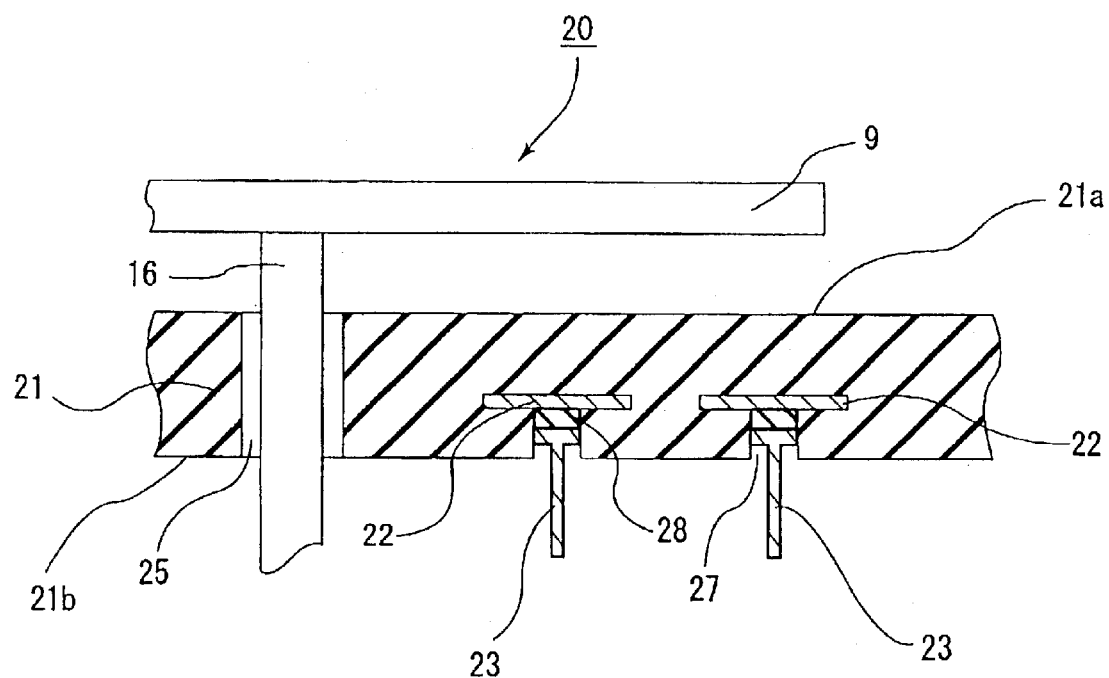
FIG. 4 is a partially-enlarged sectional view which schematically shows one example of a hot plate for a semiconductor producing/examining device of the present invention, in which hot plate a resistance heating element is formed inside of the hot plate.

FIG. 4 is a partially enlarged sectional view which schematically shows another example of the hot plate of the present invention. In the hot plate of FIG. 4, a resistance heating element is formed inside the ceramic substrate.

In the hot plate, a ceramic substrate 21 is formed so as to have a disc-like shape as is the case with the hot plate shown in FIG. 1, and a resistance heating element 22 is provided inside the ceramic substrate 21 in a pattern similar to that shown in FIG. 1, i.e., in the concentric circles-like pattern in which each set of two adjacent concentric circles form a set of circuit, although the structure of the resistance heating element 22 is not shown by drawings.

A conductor-filled through hole 28 is formed right under the end portion of the resistance heating element 22. A blind hole 27 is formed on the bottom face 21b of the ceramic substrate 21 such that the conductor-filled through hole 28 is exposed outside. An external terminal 23 is inserted in the blind hole 27 and connected thereto by using a brazing-filler (not shown) and the like.

Although not shown in FIG. 4, a socket having a conductive wire, for example, is connected to the external terminal 23 in a manner similar to that in the hot plate of FIG. 1. The conductive wire is connected to a power source.

In the hot plate shown in FIG. 4, the surface of the heating face has the glossiness of 1.5% or more, and is very flat. Accordingly, the object to be heated such as a silicon wafer and the like can be evenly heated, by using the hot plate of FIG. 4, in a manner similar to that of the hot plate shown in FIGS. 1 and 2.

The ceramic substrate according to the present invention preferably comprises at least one type of the ceramic material selected from the group consisting of nitride ceramic, carbide ceramic and oxide ceramic.

Examples of the nitride ceramic include metal nitride ceramic such as aluminum nitride, silicon nitride, boron nitride, titanium nitride and the like.

Examples of the carbide ceramic include metal carbide ceramic such as silicon carbide, zirconium carbide, titanium carbide, tantalum carbide, tungsten carbide and the like.

Examples of the oxide ceramic include metal oxide ceramic such as alumina, zirconia, cordierite, mullite, MgO, CaO, $TiO_2$ and the like.

In the present invention, it is preferable that two or more types of these oxide ceramics are used in combination. For example, a mixture of oxides such as alumina, silica, CaO, MgO and the like is likely to have a dense structure.

Among the above-mentioned examples of ceramic, the ceramic materials which are non-oxide type are preferable, because non-oxide ceramics have excellently high heat conductivity and can excellently transfer the heat generated at the resistance heating element to the object to be heated. As such a non-oxide ceramic, a nitride ceramic is especially preferable.

Among the above-mentioned examples of the nitride ceramic, the aluminum nitride is the most preferable because the heat conductivity thereof is the highest (180 W/mK).

In a case that the above-mentioned nitride ceramic incorporates oxygen, the sintering process is facilitated, the porosity is significantly decreased and the diameter of the remaining pore is made small, whereby grinding can be more easily carried out and the glossiness of the surface thereof is enhanced.

The ceramic substrate constituting the hot plate of the present invention contains preferably 0.05 to 10 weight %; or especially preferably 0.1 to 5 weight % of oxygen. When the oxygen content in the ceramic substrate is less than 0.1 weight %, the glossiness of the substrate surface may not be enhanced by grinding; or a sufficient breakdown voltage may not be obtained, due to the poor sintering property of the substrate. On the other hand, when the oxygen content in the ceramic substance exceeds 5 weight %, the heat conductivity is lowered and the temperature-rising/dropping property of the substrate may deteriorate. Further, the above-mentioned ceramic substrate most preferably contains 0.5 weight % or more of oxygen, this is because the grains at the ceramic substrate surface can be easily made round by subjecting the ceramic substrate to annealing when the content of oxygen in the ceramic substrate is in this range.

Oxygen is introduced to the ceramic substrate by: adding a sintering aid; or firing a non-oxide ceramic in air or oxygen.

In general, a metal oxide is mixed into the raw material powder of non-oxide ceramic and the mixture is fired so that oxygen is incorporated into the non-oxide ceramic.

When nitride ceramic is used as the above-mentioned non-oxide ceramic, examples of the metal oxide to be mixed with the nitride ceramic include an oxide of an alkali metal, an alkaline earth metal and a rare earth metal. Specific examples thereof include yttria ($Y_2O_3$), alumina ($Al_2O_3$), rubidium oxide ($Rb_2O$), lithium oxide ($Li_2O$), calcium oxide ($CaO_3$) and the like.

The preferable content of the metal oxide in the nitride ceramic is 1 to 10 parts by weight with reference to 100 parts by weight of the nitride ceramic.

The porosity of the above-mentioned ceramic substrate is preferably 5% or less.

When the porosity exceeds 5%, the possibility that pores are exposed on the substrate surface at the time of the grinding process increases, whereby the flatness of the substrate surface deteriorates and it is difficult to achieve the surface glossiness of 1.5% or more.

Accordingly, the porosity is more preferably in a range of 0.1 to 1.0% or so.

The pore diameter of the above-mentioned ceramic substrate is preferably 5 μm or less, and more preferably in a range of 0.1 to 3 μm.

When the average of the pore diameter exceeds 5 μm, pores are more likely to be exposed on the substrate surface, whereby the surface flatness of the substrate deteriorates.

The above-mentioned porosity is measured by the Archimedes' method. This method includes the steps of: pulverizing the sintered body and putting the pulverized sample into an organic solvent or mercury, to measure the volume thereof; obtaining the true specific gravity from the weight of the pulverized sample and the volume thereof; and calculating the porosity from the obtained true specific gravity and the apparent specific gravity.

The measurement of the average diameter of pore is performed by: preparing five samples and grinding the surfaces thereof into mirror planes; photographing the surface of each sample at ten sites by an electron microscope with 2000 to 5000 magnification; and obtaining the average of the pore diameters of the photographed 50 shots. Note that the longest portion at each pore is measured as the diameter of the pore thereof.

The above-mentioned hot plate desirably contains carbon by the amount of 50 to 5000 ppm. By adding carbon, the ceramic substrate can be blackened so that the radiation heat can be fully utilized when the hot plate is used as a heater.

The carbon may be amorphous or crystalline. When amorphous carbon is used, the decrease in the volume resistivity at a high temperature can be prevented. When the crystalline carbon is used, the decrease in the heat conductivity at a high temperature can be prevented. Accordingly, both crystalline carbon and amorphous carbon may be used depending on the application. The content of carbon is preferably in a range of 50 to 2000 ppm.

In the hot plate of the present invention, a resistance heating element is generally provided on the bottom face or inside the ceramic substrate, and a silicon wafer and the like is heated by the heat generated by the resistance heating element. However, the heating or cooling of the ceramic substrate may be carried out by providing a Peltier device.

In a case that the resistance heating element is provided inside the ceramic substrate, plural layers of the resistance heating element may be provided therein. In this case, it is preferable that the patterns at the layers are designed so that the patterns complement each other. For example, a structure such as staggered arrangement may be used.

Examples of the resistance heating element material include a sintered body of metal or conductive ceramic, a metal foil, a metal wire and the like. As the metal sintered body, at least one type selected from tungsten sintered body and molybdenum sintered body is preferable, because these metals are relatively less likely to be oxidized and have a sufficient resistance value for generating heat.

As the conductive ceramic, at least one type selected from carbides of tungsten and molybdenum may be used.

Further, in a case that the resistance heating element is formed on the bottom face of the ceramic substrate, it is preferable to use noble metal (gold, silver, palladium, platinum) or nickel as the metal sintered body. Specifically, silver, silver-palladium and the like can be preferably used.

The shape of the metal particles used for producing the metal sintered body may be either spherical or scaly. Alternatively, both spherical particles and scaly particles may be used in a mixed manner.

In the case that the resistance heating element is provided on the surface, a metal oxide may be added to the metal sintered body. The metal oxide is used in order to tightly adhere the metal particles to the ceramic substrate. The reason why the metal oxide improves the adhesion of the metal particles to the ceramic substrate is not clearly known. A thin oxidized film is formed on the surface of the metal particle, and an oxidized film is also formed on the surface of the ceramic substrate, regardless of whether the ceramic substrate is oxide ceramic or non-oxide ceramic. It is thus assumed that the oxidized film of the metal particle and that of the ceramic substrate are combined to one film by way of the metal oxide when these oxidized films are sintered at the surface of the ceramic substrate, whereby the metal particles tightly adhere to the ceramic substrate.

As the metal oxide, at least one type of compound selected from the group consisting of lead oxide, zinc oxide, silica, boron oxide ($B_2O_3$), alumina, yttria and titania is preferably used, because these oxides can improve adhesion of the metal particles to the ceramic substrate without increasing the resistance value of the resistance heating element too much.

The content of the metal oxide is preferably 0.1 parts by weight or more and less than 10 parts by weight with reference to 100 parts by weight of the metal particles. By using the metal oxide within the aforementioned range, the adhesion between the metal particles and the ceramic substrate can be enhanced without increasing the resistance value too much.

The contents of lead oxide, zinc oxide, silica, boron oxide ($B_2O_3$), alumina, yttria and titania are preferably 1 to 10 parts by weight for lead oxide, 1 to 30 parts by weight for silica, 5 to 50 parts by weight for boron oxide, 20 to 70 parts by weight for zinc oxide, 1 to 10 parts by weight for alumina, 1 to 50 parts by weight for yttria and 10 to 50 parts by weight for titania, with reference to the whole weight of the metal oxides expressed as 100 parts by weight. It is preferable that these contents of the metal oxides are adjusted so that the total sum of the metal oxides does not exceed 100 parts by weight, because these metal oxides can especially enhance adhesion thereof to the ceramic substrate in the above-mentioned range.

In a case that the resistance heating element is provided on the bottom face of the ceramic substrate, the surface of the resistance heating element 12 is preferably covered with a metal covering layer 12a (refer to FIG. 2). As the resistance heating element 12 is a sintered body of metal particles, the resistance heating element 12 is easily oxidized if it is exposed in the air, and the resistance value thereof changes due to the oxidization. By covering the surface of the resistance heating element 12 with a metal covering layer 12a, such oxidization can be prevented.

The thickness of the metal covering layer 12a is preferably in a range of 0.1 to 10 μm. When the thickness of the metal covering layer 12a is within this range, the oxidization of the resistance heating element can be prevented without changing the resistance value of the resistance heating element too much.

The metal used for the metal covering layer is not particularly limited, as long as the metal is non-oxidizable. Specific examples thereof include at least one type of metal selected from the group consisting of gold, silver, palladium, platinum and nickel. Among these examples, nickel is the most preferable. The resistance heating element requires a terminal for effecting connection of the resistance heating element to the power source, and this terminal is attached to the resistance heating element through solder. Herein, nickel effectively prevents the heat dissipation due to solder. As the connection terminal, a terminal pin made of Kovar can be used.

In a case that the resistance heating element is formed inside the ceramic substrate, the surface of the resistance heating element is not oxidized and thus no covering by the metal layer is required. When the resistance heating element is formed inside the ceramic substrate, a portion of the surface of the resistance heating element may be exposed outside of the heater plate.

Preferable examples of the metal foil used as the resistance heating element include a resistance heating element produced by a pattern-forming process such as etching of nickel foil or stainless foil.

The metal foils which have been subjected to the pattern-forming process may be laminated with a resin film and the like.

Example of the metal wire include a tungsten wire, a molybdenum wire and the like.

In a case that a Peltier device is used as the temperature controlling means, either heating or cooling can be performed by the same element by changing the flow direction of the current, which is advantageous.

In the present invention, a thermocouple may be embedded in the bottomed hole 14 of the ceramic substrate 11, according to necessity. In such a structure, the temperature of the resistance heating element can be measured by the thermocouple, so that the temperature of the resistance heating element can be controlled by changing the magnitude of the voltage or the current on the basis of the obtained data.

It is preferable that the size of the connecting portion of the metal wire of the thermocouple is the same as or larger than the strand diameter of each metal wire, and 0.5 mm or less. The heat capacity of the connecting portion is made small by adapting such a structure, whereby the temperature is converted into the current value correctly and rapidly. As a result, the temperature controllability is improved and the temperature distribution on the heating face of the wafer is made small.

Examples of the aforementioned thermocouple include the K-type, the R-type, the B-type, the S-type, the E-type, the J-type and the T-type thermocouples, as is raised in JIS-C-1602 (1980).

Next, the method of producing the hot plate of the present invention will be described.

FIGS. 5(a) to 5(d) are sectional views which schematically depict the method of producing a hot plate having a resistance heating element formed on the bottom face of the ceramic substrate thereof.

(1) Production Process of a Ceramic Substrate

The above-mentioned ceramic powder such as aluminum nitride and the like is blended with a sintering aid comprising an oxide such as yttria and the like, a binder and the like, according to necessity, whereby a slurry is prepared. The prepared slurry is granulated by an appropriate method such as spray drying. The obtained granules are filled in a mold and the like and pressed for forming, so that a raw formed body (green) is produced. Amorphous or crystalline carbon may be added at the time of slurry preparation as described above.

Here, when the raw formed body (green) is produced, it is preferable that the raw formed body (green) is then subjected to cold isostatic pressing (CIP) and the like. In a case that the formed body which has not been sintered is evenly pressed by cold isostatic pressing and the like, sintering proceeds evenly and thus the density of the sintered substrate is enhanced, whereby the glossiness of the surface thereof can be easily adjusted so as to be 1.5% or more.

The pressure of the above-mentioned cold isostatic pressing (CIP) is preferably in a range of 50 to 500 MPa.

Next, the raw formed body is heated and fired to effect sintering, whereby a plate-formed body made of ceramic is produced. Thereafter, a ceramic substrate 11 is produced by processing the plate-formed body into a predetermined shape. Alternatively, the plate-formed body may be produced such that the plate-formed body can be used as the ceramic substrate 11 after firing without any further processing (FIG. 5(a)). A ceramic substrate 11 having no pore can be produced by conducting heating and firing with applying a pressure. The temperature at which heating and firing are to be carried out is not particularly restricted as long as the temperature is no lower than the sintering temperature. In the case of nitride ceramic, the preferable temperature range is 1000 to 2500° C. In this case, the firing temperature is more preferably in a range of 1600 to 2100° C.

Next, a through hole through which a supporting pin for supporting a silicon wafer is inserted, a through hole 15 through which a lifter pin for transferring a silicon wafer is inserted, the bottomed hole 14 in which a temperature measuring element such as a thermocouple is embedded, and the like are optionally formed in the ceramic substrate 11.

(2) Process for Printing a Conductor containing Paste on the Ceramic Substrate

A conductor containing paste is generally a fluid substance having high viscosity, comprising metal particles, a resin and a solvent. By printing, by screen printing and the like, this conductor containing paste on a portion of the ceramic substrate at which portion the resistance heating element is to be provided, a conductor containing paste layer is formed. As the resistance heating element is required to heat the ceramic substrate evenly such that the ceramic substrate as a whole reaches the same temperature, it is preferable that the resistance heating element is printed so as to have a concentric circles-like pattern or a pattern in which the concentric circles-like pattern and the winding line-like pattern are combined.

It is preferable that the conductor containing paste layer is formed such that the section of the resistance heating element 12 after sintering has a quadrilateral, flat section.

(3) Firing of the Conductor Containing Paste

The conductor containing paste layer printed on the bottom face of the ceramic substrate 11 is heated and fired, so that the resin and the solvent are removed and the metal particles are sintered and baked on the bottom face of the ceramic substrate 11, whereby the resistance heating element 12 is formed (refer to FIG. 5(b)). The temperature during the heating and firing process is preferably in a range of 500 to 1000° C.

In a case that the above-mentioned metal oxide is added to the conductor containing paste, the metal particles, the ceramic substrate and the metal oxide are sintered and made integral, whereby adhesion between the resistance heating element and the ceramic substrate is improved.

Thereafter, the surface of the sintered body is ground by using a surface grinding machine. The surface is further ground by using a diamond whetstone of #100 to #8000. Next, the glossiness of the surface of the sintered body is adjusted by polishing the surface with diamond slurry whose average particle diameter is 0.1 to 10 $\mu$m, colloidal silica or alumina suspension.

Alternatively, the surface of the sintered body may be subjected to annealing for 1 to 3 hours at the temperature of 1400 to 1800° C., so that the glossiness of the heating face for the semiconductor wafer is enhanced.

The above-mentioned grinding treatment, polishing treatment and annealing treatment may be carried out in the combined manner.

(4) Formation of the Metal Covering Layer

Next, a metal covering layer 12a is provided on the surface of the resistance heating element 12 (FIG. 5(c)). The metal covering layer 12a can be formed by electrolytic plating, electroless plating, spattering and the like. Among these methods, electroless plating is the most preferable in terms of achieving high productivity.

(5) Attaching of the Terminals and the Like

External terminals 13 for effecting connection to the power source are attached to the end portions of the circuit of the resistance heating element 12 through a solder paste layer 130 (refer to FIG. 5(d)). A temperature measuring element 18 such as a thermocouple and the like is inserted in the bottomed hole 14 and the bottomed hole 14 is sealed by using a heat resistant resin and the like, such as polyimide. Further, a socket and the like (not shown) having conductive wires, for example, is attached to the external terminal 17 in a detachable manner.

(6) Thereafter, the ceramic substrate having the resistance heating element 12 as described above is fitted to, for example, a cylindrical supporting case and the lead wire extending from the socket is connected to the power source, whereby the production of the hot plate is completed.

When the above-mentioned hot plate is produced, an electrostatic chuck can be produced by providing electrostatic electrodes inside the ceramic substrate, or a wafer prober can be produced by providing a chuck top conductor layer on the heating face and providing a guard electrode and a ground electrode inside the ceramic substrate.

In the case that the electrodes are provided inside the ceramic substrate, such a structure can be realized by embedding a metal foil and the like inside the ceramic substrate. In the case that conductor layer is formed on the surface of the ceramic substrate, such a process can be carried out by spattering or plating or by the combination of spattering and plating.

Next, a method of producing the hot plate having the resistance heating element formed inside the ceramic substrate thereof, according to the present invention, will be described hereinafter.

FIGS. 6(a) to 6(d) are sectional views which schematically depict the method of producing a hot plate having a resistance heating element formed inside the ceramic substrate thereof.

(1) Process of Producing a Green Sheet

First, a paste is prepared by mixing nitride ceramic powder with a binder, a solvent and the like. A green sheet is then produced by using the paste.

As the above-mentioned ceramic powder, aluminum nitride and the like can be used. A sintering aid comprising an oxide such as yttria and the like may optionally be added to the ceramic powder. When a green sheet is produced, crystalline or amorphous carbon may be added.

As the binder, at least one type of binder selected from the group consisting of an acrylic binder, ethyl cellulose, butyl cellosolve and polyvinyl alcohol is preferably used.

As the solvent, at least one type of solvent selected from $\alpha$-terpineol and glycol is preferably used.

The paste obtained by mixing the above-mentioned components is formed into a sheet-like shape by the doctor blade method, whereby a green sheet 50 is produced.

The thickness of the green sheet 50 is preferably in a range of 0.1 to 5 mm.

Next, a portion which is to serve as the through hole through which the supporting pin for supporting a silicon wafer is inserted, a portion which is to serve as the through hole 25 through which the lifter pin for transferring a silicon wafer is inserted, a portion which is to serve as the bottomed hole 24 in which a temperature measuring element such as a thermocouple is embedded, a portion which is to serve as a conductor-filled through hole 28 for effecting connection of the resistance heating element to the external terminal, and the like are optionally formed in the obtained green sheet. The above-mentioned processing may be carried out after the formation of a green sheet lamination described below.

(2) Process of Printing the Conductor Containing Paste on the Green Sheet

The conductor containing paste containing metal paste or electrically conductive ceramic is printed on the green sheet 50, whereby a conductor containing paste layer 220 is formed on the green sheet 50. Further, the conductor containing paste is filled at the portion which is to serve as the conductor-filled through hole 28, whereby a conductor containing paste-filled layer 280 is formed on the green sheet 50.

The conductor containing paste contains metal particles or electrically conductive ceramic particles.

The average particle diameter of tungsten particles or molybdenum particles as the above-mentioned metal particles is preferably in a range of 0.1 to 5 $\mu$m. When the average particle diameter thereof is smaller than 0.1 $\mu$m or exceeds 5 $\mu$m, the conductor containing paste may not be properly printed on the green sheet.

Examples of such conductor containing paste include a composite (paste) which is obtained by mixing: 85 to 87 parts by weight of metal particles or conductive ceramic particles; 1.5 to 10 parts by weight of at least one type of binder selected from the group consisting of an acrylic binder, ethyl cellulose, butyl cellosolve and polyvinyl alcohol; 1.5 to 10 parts by weight of at least one type of solvent selected from $\alpha$-terpineol and glycol.

(3) Process of Laminating the Green Sheets

The green sheets 50 on which the conductor containing paste has not been printed, produced in the above-mentioned process (1), are laminated on the upper and lower surfaces of the green sheet 50 having the conductor containing paste layer 220 printed thereon produced in the above-mentioned process (2) (FIG. 6(a)).

Here, the number of the green sheets 50 laminated on the upper side of the green sheet having the conductor containing paste layer 220 thereon is set larger than the number of the green sheets 50 laminated on the lower side of the green sheet 50 having the conductor containing paste layer 220 thereon, so that the resistance heating element 22 is located in the lamination at a position closer to the bottom face rather than the top face of the lamination.

Specifically, the preferable number of the green sheets 50 laminated on the upper side of the green sheet having the conductor containing paste later 220 thereon is 20 to 50, and the preferable number of the green sheet 50 laminated on the lower side of the core green sheet is 5 to 20.

Here, when the green sheets are laminated, it is preferable that the obtained green sheet lamination is then subjected to cold isostatic pressing (CIP) and the like. In a case that the green sheet lamination which has not been sintered is evenly pressed by cold isostatic pressing and the like, sintering thereafter proceeds evenly and thus the density of the sintered substrate is enhanced, whereby the glossiness of the substrate surface can be easily adjusted so as to be 1.5% or more. Preferably, the pressure for the above-mentioned cold isostatic pressing (CIP) is 50 to 500 MPa.

(4) Firing Process of the Green Sheet Lamination

The green sheet lamination is subjected to heating and pressurizing and the green sheet 50 and the conductor containing paste therein are sintered, whereby a ceramic substrate 21 is produced.

The temperature at which the green sheet lamination is heated is preferably in a range of 1000 to 2000° C. The pressure to be applied to the green sheet lamination is preferably in a range of 10 to 20 MPa. The heating temperature is more preferably in a range of 1600 to 2100° C. The heating is carried out in an inert gas atomosphere. As the inert gas, argon, nitrogen and the like, for example, may be used.

Thereafter, the surface of the sintered body is ground by using a surface grinding machine. The surface is further ground by using a diamond whetstone of #100 to #8000. Next, the glossiness of the surface of the sintered body is adjusted by polishing the surface with diamond slurry whose average particle diameter is 0.1 to 10 $\mu$m, colloidal silica or alumina suspension.

Alternatively, the surface of the sintered body may be subjected to annealing for 1 to 3 hours at the temperature of 1400 to 1800° C., so that the glossiness of the heating face of the semiconductor wafer is enhanced.

The above-mentioned grinding treatment, polishing treatment and annealing treatment may be carried out in the combined manner.

A through hole 25 through which the lifter pin is inserted and the bottomed hole 24 in which a temperature measuring element is inserted are generally formed in the obtained ceramic substrate 21 (FIG. 6(b)). Further, a blind hole 27 at which the conductor-filled through hole 28 is exposed is formed in the ceramic substrate 21 (FIG. 6(c)). The through hole 25, the bottomed hole 24 and the blind hole 27 can be formed on the substrate surface, after the grinding of the substrate surface, by effecting the drilling process or the blasting process such as sand blast on the substrate surface.

Next, the external terminal 23 is connected to the conductor-filled through hole 28, which is exposed from the blind hole 27, by using gold brazing and the like (FIG. 6(d)). Further, a socket including conductive wires, for example, is attached to the external terminal 23 in a detachable manner.

In the case that solder is used for the above-mentioned process, the temperature at which heating is carried out is preferably in a range of 90 to 450° C. In the case that brazing filler is used for the above-mentioned process, the temperature at which heating is carried out is preferably in a range of 900 to 1100° C. A thermocouple and the like as the temperature measuring element is sealed by using a heat resistant resin, whereby a ceramic heater is produced.

In the production process of the above-mentioned hot plate, an electrostatic chuck can be produced by providing electrostatic electrodes inside the ceramic substrate, or a wafer prober can be produced by providing a chuck top conductor layer on the heating face and providing a guard electrode and a ground electrode inside the ceramic substrate.

In the case that the electrodes are provided inside the ceramic substrate, such a structure can be realized by forming a conductor containing paste layer on the surface of the green sheet, in a manner similar to that of forming a resistance heating element. Further, in the case that conductor layer is formed on the surface of the ceramic substrate, such a process can be carried out by sputtering or plating or by the combination of sputtering and plating.

BEST MODE FOR IMPLEMENTING THE INVENTION

The present invention will be described further in detail hereinafter.

EXAMPLE 1

Figure 6:
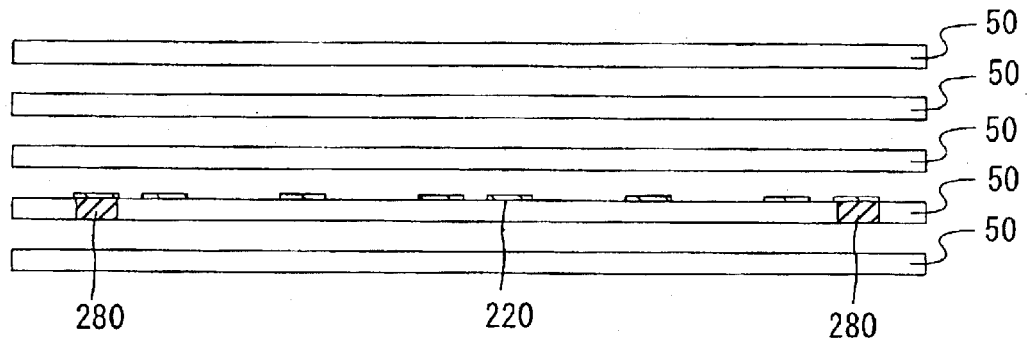
FIGS. 6(a) to 6(d) are sectional views which schematically show a part of the process of manufacturing a hot plate for a semiconductor producing/examining device of the present invention, in which hot plate a resistance heating element is formed inside of the hot plate.
Figure 6:
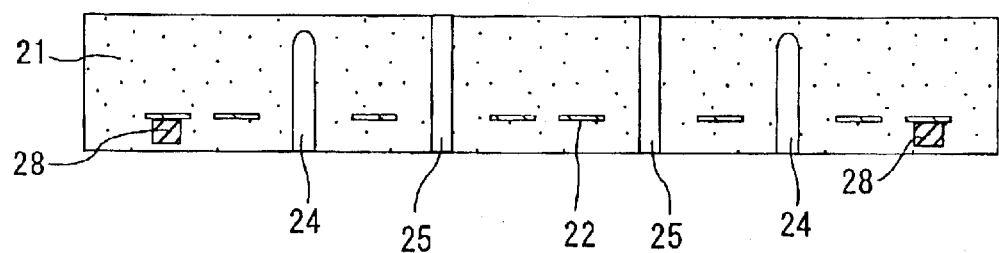
Figure 6:
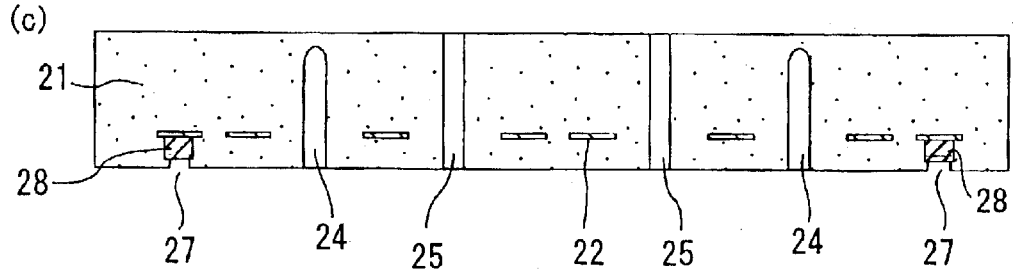
Figure 6:
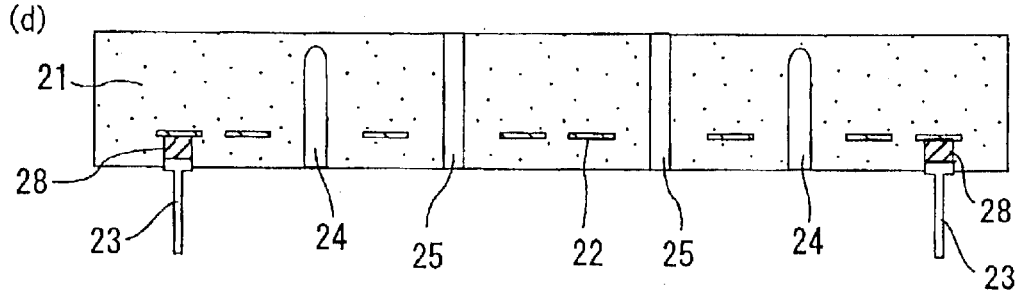

Production of a Hot Plate (Refer to FIG. 6)

(1) A paste was produced by mixing: 100 parts by weight of aluminum nitride powder (manufactured by Tokuyama Co., Ltd., the average particle diameter: 1.1 $\mu$m); 4 parts by weight of yttria (the average particle diameter: 0.4 $\mu$m); 11.5 parts by weight of an acrylic binder; 0.5 parts by weight of a dispersant; and 53 parts by weight of alcohol comprising 1-butanol and ethanol. By using the obtained paste and performing the forming process according to the doctor blade method, a green sheet having thickness of 0.47 mm was obtained.

(2) Next, the green sheet was dried for five hours at 80° C. Thereafter, portions which were to serve as conductor-filled through holes (through holes) for effecting connection to external terminals were formed in the green sheet.

(3) A conductor containing paste A was prepared by mixing: 100 parts by weight of tungsten carbide particles whose average particle diameter was 1 $\mu$m; 3.0 parts by weight of an acrylic binder; 3.5 parts by weight of α-terpineol as a solvent; and 0.3 parts by weight of a dispersant.

A conductor containing paste B was prepared by mixing: 100 parts by weight of tungsten particles whose average particle diameter was 3 $\mu$m; 1.9 parts by weight of an acrylic binder; 3.7 parts by weight of α-terpineol as a solvent; and 0.2 parts by weight of a dispersant.

The conductor containing paste A was printed on a green sheet by screen printing, whereby a conductor containing paste layer 220 was formed. The printing pattern was a concentric circles-like pattern.

The conductor containing paste B was filled in the through holes provided so as to be used as the conductor-filled through holes for effecting connection to the external terminals.

The green sheet 50 which had been subjected to the above-mentioned treatment was laminated with: 34 sheets of the green sheet 50 on which the tungsten paste had not been printed, which were provided at the upper side thereof (on the heating face thereof); and 13 sheets of the green sheet 50 on which the tungsten paste had not been printed, which were provided at the lower side thereof, at 130° C. and at a pressure of 8 MPa (80 kg/cm$^2$), whereby a lamination was formed (refer to FIG. 6(*a*)). Thereafter, the obtained lamination was subjected to cold isostatic pressing (CIP) at the pressure of 300 MPa.

(4) Next, the obtained lamination was degreased in nitrogen gas at 600° C. for 5 hours and then hot-pressed for 3 hours at 1890° C. and at a pressure of 15 MPa (150 kg/cm$^2$), whereby a plate-formed body of aluminum nitride having thickness of 3 mm was obtained. This plate-formed body of aluminum nitride was cut out to disc-like shape having diameter of 230 mm, whereby a plate-formed body made of aluminum nitride (a ceramic substrate 21) having a resistance heating element 22 (thickness: 6 μm and width: 10 mm) inside thereof was obtained (FIG. 6(*b*)).

(5) Next, the surface of the heating face of the ceramic substrate obtained in the above-described (4) was processed by using a surface grinding machine. The surface was further ground by using a diamond whetstone of #2000 (a diamond pad manufactured by Maruto Co., Ltd.). Next, the heating face was polished with a felt cloth by using a diamond slurry whose particle size was 0.25 μm (manufactured by Maruto Co., Ltd.).

Thereafter, a mask was set thereon and a through hole 25 through which a lifter pin was to be inserted and a bottomed hole 24 (diameter: 1.2 mm, depth: 2 mm) in which a temperature measuring element 18 such as a thermocouple was to be embedded were formed on the heating face of the ceramic substrate by the blasting process using SiC and the like.

(6) Next, a blind hole 27 was formed by hollowing out a portion where the conductor-filled through hole 28 had been formed (FIG. 6(*c*)). An external terminal 23 made of Kovar was connected to the blind hole 27 by using gold brazing of Ni—Au and effecting heating and reflowing at 700° C. (FIG. 6(*d*)). It is preferable that the connection of the external terminals is effected by a structure in which the external terminal is supported by the support of tungsten at three sites. This is because, the external terminals can be reliably connected to the blind holes in such a structure.

(7) Next, a plurality of thermocouples for controlling the temperature were embedded in the bottomed hole 24, whereby the production of a hot plate having a resistance heating element was completed.

EXAMPLE 2
Production of a Hot Plate

A ceramic substrate was produced in a manner similar to that of example 1 up to the above-mentioned processes (1) to (4). The resulting ceramic substrate was then subjected to the grinding treatment in the conditions described below.

(5) The surface (the heating face) of the ceramic substrate obtained in the above-described (4) was surface-processed by using a surface grinding machine. The surface was further ground by using a diamond whetstone of #2000 (a diamond pad manufactured by Maruto Co., Ltd.). Next, the heating face was polished with a felt cloth by using a diamond slurry whose particle size was 3.0 μm (manufactured by Maruto Co., Ltd.).

After the grinding process described above, a mask was set on the bottom face of the substrate and a through hole 25, and a bottomed hole 24 in which a temperature measuring element 18 such as a thermocouple was to be embedded were formed at the face by the blasting process using SiC and the like.

(6) Next, a blind hole 27 for exposing the conductor-filled through hole 28 was formed in the ceramic substrate 21. An external terminal pin 23 made of Kovar was connected to the blind hole 27 by using gold brazing of Ni—Au alloy (Au: 81.5 weight %, Ni: 18.4 weight % and impurities: 0.1 weight %) and effecting heating and reflowing at 970° C.

(7) Next, a plurality of thermocouples for controlling the temperature were embedded in the bottomed hole 24, whereby a hot plate was obtained.

Figure 5:
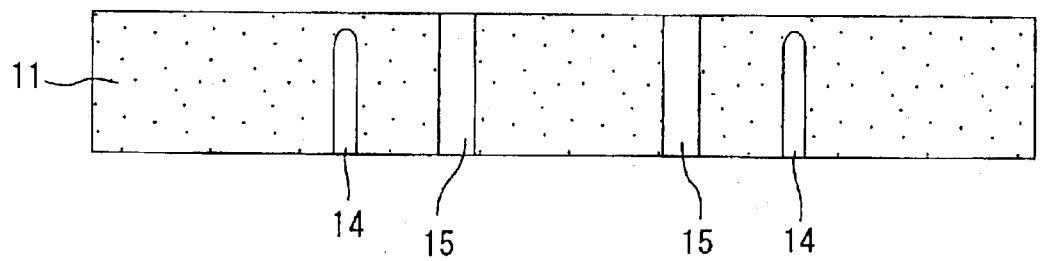
FIGS. 5(a) to 5(d) are sectional views which schematically show a part of the process of manufacturing a hot plate for a semiconductor producing/examining device of the present invention, in which hot plate a resistance heating element is formed on the bottom face thereof.
Figure 5:
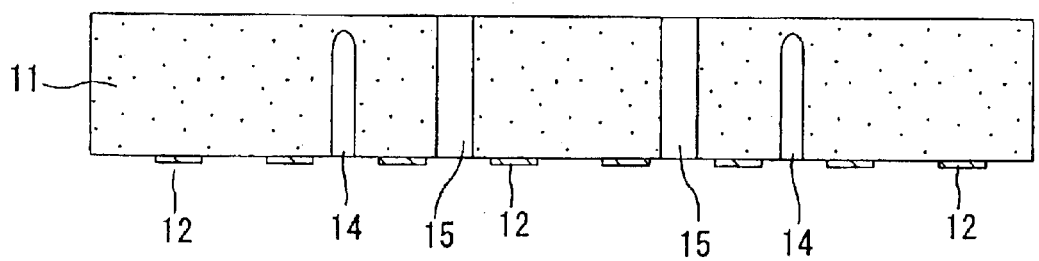
Figure 5:
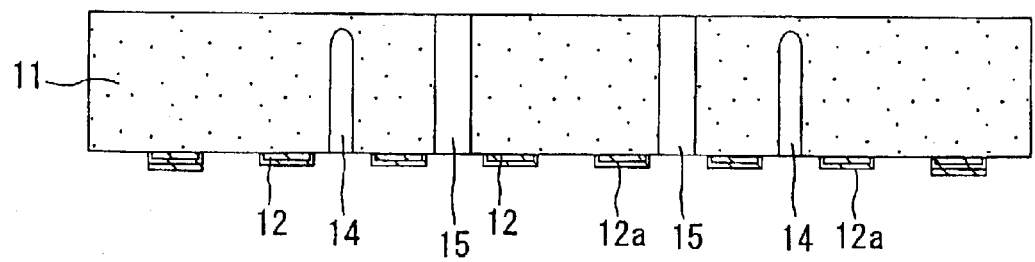
Figure 5:
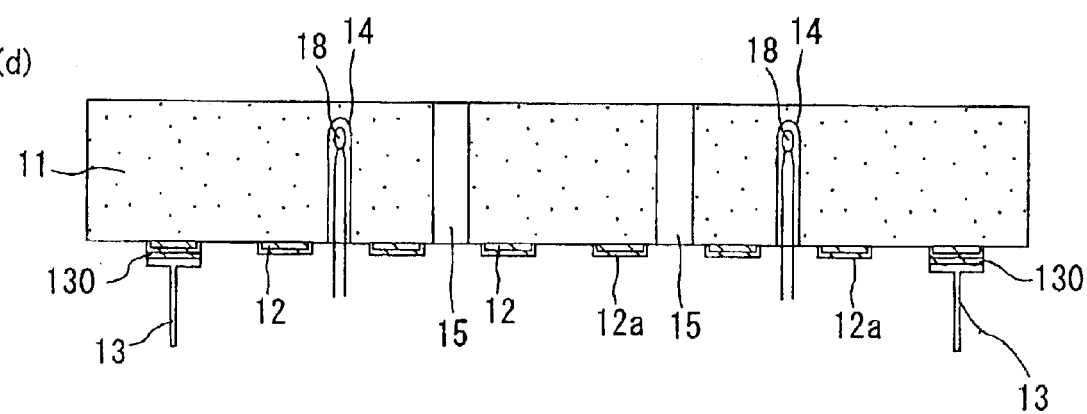

EXAMPLE 3
Production of a Hot Plate (Refer to FIG. 5)

(1) A composition was prepared by mixing: 100 parts by weight of aluminum nitride powder (manufactured by Tokuyama Co., Ltd., the average particle diameter: 1.1 μm); 4 parts by weight of yttria (the average particle diameter: 0.4 μm); 12 parts by weight of an acrylic binder; and alcohol. By granulating the obtained composition by spray drying, granular powder was produced.

(2) Next, the prepared granular powder was filled in a mold and formed in a plate-like shape, so that a raw formed body was produced. Thereafter, the obtained raw formed body was subjected to cold isostatic pressing (CIP) at the pressure of 300 MPa.

Next, the raw formed body which had been subjected to the above-mentioned processing was hot-pressed at 1890° C. and at a pressure of 15 MPa, whereby a plate-formed body of aluminum nitride having thickness of 3 mm was obtained. This plate-formed body of aluminum nitride was cut out to disc-like shape having diameter of 230 mm, whereby a ceramic substrate 11 was obtained.

(3) Next, the heating face of the ceramic substrate 11 obtained as described above was processed by using a surface grinding machine. The surface was further ground by using an alumina abrasive of #2000 (Arandam, manufactured by Maruto Co., Ltd.). Next, the heating face was polished with a felt cloth by using a diamond slurry whose particle size was 3.0 μm.

Thereafter, a mask was set thereon and a bottomed hole 14 (diameter: 1.2 mm, depth: 2.0 mm) in which a temperature measuring element 18 such as a thermocouple was to be embedded and a through hole 15 through which a lifter pin was to be inserted were formed at the bottom face of the substrate by the blasting process using SiC and the like.

(4) A conductor containing paste was printed, by screen printing, on the bottom face of the ceramic substrate 11 which had been subjected to the above-mentioned process (3). The printing pattern was a pattern as shown in FIG. 1, in which the concentric circles-like pattern and the winding line-like pattern were combined.

As the conductor containing paste, SOLVEST PS603D manufactured by Tokuriki Kagaku Kenkyujo, which is used for forming a plated through hole of a print circuit board, was employed.

The conductor containing paste was a silver-based paste containing 7.5 parts by weight of metal oxides with reference to 100 parts by weight of silver. The metal oxides were composed of: lead oxide (5 parts by weight); zinc oxide (55 parts by weight); silica (10 parts by weight); boron oxide (25 parts by weight); and alumina (5 parts by weight). The average particle diameter of the silver particles was 4.5 μm and the shape of the silver particles was scaly.

(5) Next, the sintered body on which the conductor containing paste had been printed was heated at 780° C. and fired, so that the silver, lead and the like in the conductor containing paste were sintered and baked on the sintered body, whereby the resistance heating element was formed. The thickness, the width and the sheet resistivity of the silver-based resistance heating element 12 were 5 μm, 2.4 mm and 7.7 mΩ/□, respectively.

(6) The sintered body produced in the above-mentioned process (5) was immersed in an electroless nickel plating bath comprising aqueous solutions of nickel sulfate (80 g/L), sodium hypophosphite (24 g/L), sodium acetate (12 g/L), boric acid (8 g/L) and ammonium chloride (6 g/L), so that a metal covering layer (a nickel layer) 12a having thickness of 1 μm was deposited on the surface of the silver-based resistance heating element 12.

(7) A solder layer was formed by screen printing a silver-lead solder paste (manufactured by Tanaka Noble Metal Co., Ltd.) at the terminal portion of the resistance heating element, at which the connection of the resistance heating element to the power source was reliably effected.

Next, a conductive wire 66 having a T-shaped end portion was set on the solder layer and was subjected to heating and reflowing at 420° C., so that the external terminal 13 was fixed to the end portion of the resistance heating element.

(8) A thermocouple for controlling the temperature was inserted in the bottomed hole. The bottomed hole was filled with a polyimide resin. The resin was left at 190° C. for two hours so that the resin was cured, whereby a hot plate 10 having a resistance heating element 12 on the bottom face 11b thereof was obtained.

EXAMPLE 4
Production of a Hot Plate (Refer to FIG. 6)

A hot plate was produced in a manner similar to that of example 2, except that the surface grinding process was effected only by grinding by using a diamond whetstone of #2000.

COMPARATIVE EXAMPLE 1

A hot plate was produced in a manner similar to that of example 1, except that neither addition of yttria, at the time of preparing the raw material composition, nor cold isostatic pressing (CIP) was carried out.

COMPARATIVE EXAMPLE 2

A hot plate was produced in a manner similar to that of example 1, except that neither grinding by using a diamond whetstone of #2000 nor cold isostatic pressing (CIP) was carried out.

EXAMPLE 5
Production of an Alumina Hot Plate (Refer to FIG. 6)

(1) A paste was produced by mixing: 93 weight % of alumina; 5 weight % of $SiO_2$; 0.5 weight % of CaO; 0.5 weight % of MgO; 0.5 weight % of $TiO_2$; 11.5 parts by weight of an acrylic binder; 0.5 parts by weight of a dispersant; and 53 parts by weight of alcohol comprising 1-butanol and ethanol. By using the obtained paste and performing the forming process according to the doctor blade method, a green sheet having thickness of 0.47 mm was obtained.

(2) Next, the obtained green sheet 50 was dried for five hours at 80° C. Thereafter, portions (through holes) which were to serve as conductor-filled through holes for effecting connection of the resistance heating element to external terminals were provided in a green sheet which needed to be processed.

(3) A conductor containing paste B was prepared by mixing: 100 parts by weight of tungsten particles whose average particle diameter was 3 μm; 1.9 parts by weight of an acrylic binder; 3.7 parts by weight of α-terpineol; and 0.2 parts by weight of a dispersant.

The conductor containing paste B was printed on a green sheet 50 by screen printing, whereby a conductor containing paste layer was formed. The printing pattern was a concentric circles-like pattern.

(4) Further, the conductor containing paste B was filled in the through holes formed so as to be used as the conductor-filled through holes for effecting connection of the resistance heating element to the external terminal.

The green sheet 50, on which the pattern of the resistance heating element had been formed, was laminated with: 34 to 60 sheets of the green sheet 50 on which the conductor containing paste had not been printed, which were provided at the upper (the heating face) side thereof: and 13 to 30 sheets of the green sheet 50 on which the conductor containing paste had not been printed, which were provided at the lower side thereof, at 130° C. and at a pressure of 8 MPa (80 kg/cm²), whereby a lamination was formed.

Thereafter, the lamination obtained as described above was subjected to cold isostatic pressing (CIP) at the pressure of 300 MPa.

(5) Next, the obtained lamination was degreased in air at 600° C. for 5 hours and then hot-pressed for 2 hours at 1600° C. and at a pressure of 15 MPa, whereby a plate-formed body of alumina having thickness of 3 mm was obtained. This plate-formed body of alumina was cut out to disc-like shape having diameter of 230 mm.

Next, the surface of the plate-formed body was processed by using a surface grinding machine. The surface was further ground by using an alumina abrasive of #2000 (Arandam, manufactured by Maruto Co., Ltd.). The surface was then polished with a felt cloth by using a diamond slurry whose particle size is 0.25 μm, whereby a plate-formed body (ceramic substrate) made of alumina having a resistance heating element 22 (thickness: 6 μm, width 10 mm) inside thereof was obtained. The ceramic substrate was then subjected to annealing for 1 hour at 1500° C.

(6) Next, a mask was set on the surface of the ceramic substrate obtained in the above-mentioned process (5), and a bottomed hole (diameter: 1.2 mm, depth: 2.0 mm) in which a thermocouple was to be embedded and a through hole 25 used for supporting a semiconductor wafer were formed at the surface by the blasting process using SiC and the like.

(7) Next, a blind hole 27 was formed by hollowing out a portion where the conductor-filled through hole had been formed (FIG. 6(c)). An external terminal 23 made of Kovar was connected to the blind hole 27 by using gold brazing of Ni—Au and effecting heating and reflowing at 700° C., whereby production of the hot plate was completed.

It is preferable that the connection of the external terminals is effected by a structure in which the external terminal is supported by the support of tungsten at three sites. The external terminals can be reliably connected to the blind holes in such a structure.

COMPARATIVE EXAMPLE 3

A hot plate was produced in a manner similar to that of example 5, except that none of: grinding by using a diamond whetstone of #2000; cold isostatic pressing (CIP); and annealing was carried out.

EXAMPLE 6
Hot Plate (Refer to FIG. 5)

(1) A mixture was produced by mixing: 100 parts by weight of aluminum nitride powder (manufactured by Tokuyama Co., Ltd., the average particle diameter: 1.1 μm); 4 parts by weight of yttrium oxide ($Y_2O_3$: yttria, the average particle diameter: 0.4 μm); and 11.5 parts by weight of an acrylic binder. The mixture was subjected to cold isostatic pressing (CIP) at the pressure of 300 MPa and then hot-pressed in the nitrogen atmosphere for 3 hours at 1890° C. and at a pressure of 15 MPa, whereby a sintered body of aluminum nitride was obtained.

This sintered body of aluminum nitride was processed to disc-like shape. The surface of the plate-formed body obtained as descrbied above was then processed by using a surface grinding machine. The surface of the plate-formed body was further ground by using an alumina abrasive of #2000 (Arandam manufactured by Maruto Co., Ltd.) The surface was then polished with a felt cloth by using a diamond slurry whose particle size was 1 µm (manufactured by Maruto Co., Ltd.). Thereafter, the sintered body of aluminum nitride was subjected to annealing for 1 hour at 1700° C.

(2) A conductor containing paste was printed, by screen printing, at the bottom face of the sintered body obtained in the above-mentioned process (1). The printing pattern was a concentric circles-like pattern as shown in FIG. 1.

As the conductor containing paste, SOLVEST PS603D manufactured by Tokuriki Kagaku Kenkyujo, which is used for forming a plated through hole of a print circuit board, was employed.

The conductor containing paste was a silver-based paste containing 7.5 parts by weight of metal oxides with reference to 100 parts by weight of silver. The metal oxides were composed of: lead oxide (5 parts by weight); zinc oxide (55 parts by weight); silica (10 parts by weight); boron oxide (25 parts by weight); and alumina (5 parts by weight). The average particle diameter of the silver particles was 4.5 µm and the shape of the silver particles was scaly.

(3) Next, the sintered body on which the conductor containing paste had been printed was heated at 780° C. and fired, so that the silver, lead and the like in the conductor containing paste were sintered and baked on the sintered body, whereby the resistance heating element 12 was formed. The thickness, the width and the sheet resistivity of the silver-based resistance heating element 12 were 5 µm, 2.4 mm and 7.7 mΩ/□, respectively.

(4) The sintered body produced in the above-mentioned process (4) was immersed in an electroless nickel plating bath comprising aqueous solutions of nickel sulfate (80 g/L), sodium hypophosphite (24 g/L), sodium acetate (12 g/L), boric acid (8 g/L) and ammonium chloride (6 g/L), so that a metal covering layer (a nickel layer) 12a having thickness of 1 µm was deposited on the surface of the silver-based resistance heating element 12.

(5) A solder layer was formed by screen printing a silver-lead solder paste (manufactured by Tanaka Noble Metal Co., Ltd.) at the portion at which the terminal was to be attached, where the connection of the resistance heating element to the power source was reliably effected.

Next, a terminal pin 13 made of Kovar was set on the solder layer and subjected to heating and reflowing at 420° C. so that the external terminal 13 was fixed on the surface of the resistance heating element 12.

(6) A thermocouple for controlling the temperature was inserted in the bottomed hole. The bottomed hole was then filled with a polyimide resin. The resin was left at 190° C. for two hours so that the resin was cured, whereby production of the hot plate (refer to FIG. 5) was completed.

EXAMPLE 7

(1) A composition was prepared by mixing: 100 parts by weight of SiC powder (the average particle diameter: 0.3 µm); 4 parts by weight of B$_4$C as a sintering aid; 12 parts by weight of an acrylic binder; and alcohol. By granulating the obtained composition by spray drying, granular powder was produced.

(2) Next, the prepared granular powder was filled in a mold and formed in a plate-like shape, so that a raw formed body was produced. Thereafter, the obtained raw formed body was subjected to cold isostatic pressing (CIP) at the pressure of 300 MPa.

(3) The raw formed body which had been subjected to the above-mentioned processing was hot-pressed at 2100° C. and at a pressure of 18 MPa, whereby a ceramic substrate made of SiC having thickness of 3 mm was obtained.

The ceramic substrate was subjected to annealing for 3 hours at 1600° C.

Next, a disc-shaped body having diameter of 210 mm was cut out of the plate-formed body. The surface of the disc-shaped body was polished into a mirror plane by grinding such that the surface roughness (Ra) was 0.1 µm, whereby a ceramic substrate 11 was obtained.

A sol solution was prepared by: mixing 25 parts by weight of tetraethyl silicate, 37.6 parts by weight of ethanol and 0.3 parts by weight of hydrochloric acid; and stirring the mixture solution for 24 hours, thereby effecting hydrolysis polymerization. The prepared sol solution was coated on the ceramic substrate 11 by spin coating. The SiC ceramic substrate 11 was then dried for 5 hours at 80° C., fired for 1 hour at 1000° C., whereby a SiO$_2$ film 180 having thickness of 2 µm was formed on the surface of the ceramic substrate 11. The obtained SiO$_2$ film had substantially a mirror plane whose Ra according to JIS B 0601 was 0.1 µm. The surface roughness was measured by a surface topography metrology system (P-11, made by KAL•Tencor Corporation).

The formed body was then subjected to drilling, whereby a portion which was to serve as a through hole 15 through which a supporting pin for a silicon wafer 19 was to be inserted and a bottomed hole 14 (diameter: 1.1 mm, depth: 2 mm) in which a thermocouple was to be embedded were formed thereon.

(4) A conductor containing paste was printed, by screen printing, on the ceramic substrate 11 obtained by the above-mentioned process (3). The printing pattern was a pattern as shown in FIG. 1, in which the concentric circles-like pattern and the winding line-like pattern were combined. In the pattern, terminal portions 13a, 13b, 13c, 13d and 13e were formed.

The pattern was designed so that the outermost circumference of the resistance heating element-formed area was 30 mm distanced from the side face of the above-mentioned ceramic substrate.

As the conductor containing paste, "SOLVEST PS603D" manufactured by Tokuriki Kagaku Kenkyujo, which is used for forming a plated through hole of a print circuit board, was employed.

The conductor containing paste was a silver-based paste containing 7.5 parts by weight of metal oxides with reference to 100 parts by weight of silver. The metal oxides were composed of: lead oxide (5 parts by weight); zinc oxide (55 parts by weight); silica (10 parts by weight); boron oxide (25 parts by weight); and alumina (5 parts by weight). The average particle diameter of the silver particles was 4.5 µm and the shape of the silver particles was scaly.

(5) Next, the ceramic substrate on which the conductor containing paste had been printed was heated at 780° C. and fired, so that the silver in the conductor containing paste was sintered and baked on the ceramic substrate 11, whereby the resistance heating element 12 was formed. The thickness, the width and the sheet resistivity of the silver-based resistance heating element 12 were 5 μm; 2.4 mm and 7.7 mΩ/□, respectively.

(6) The ceramic substrate 11 produced in the above-mentioned process (5) was immersed in an electroless nickel plating bath comprising aqueous solutions of nickel sulfate (80 g/L), sodium hypophosphite (24 g/L), sodium acetate (12 g/L), boric acid (8 g/L) and ammonium chloride (6 g/L), so that a metal covering layer (a nickel layer) 12a having thickness of 1 μm was deposited on the surface of the silver-lead resistance heating element 12. The surface roughness on the surface of the resistance heating element, expressed as Ra according to JIS B 0601 was 0.5 μm.

(7) A solder layer was formed by screen printing a silver-lead solder paste (manufactured by Tanaka Noble Metal Co., Ltd.) at the portion at which a terminal was to be attached for securing the connection of the resistance heating element to the power source.

Next, a terminal pin 13 made of Kovar was set on the solder layer and subjected to heating and reflowing at 420° C., so that the external terminal 13 was fixed on the surface of the resistance heating element 12.

(8) A thermocouple for controlling the temperature was inserted in the bottomed hole 14. A ceramic adhesive agent (Aronceramic, manufactured by TOAGOSEI Co., Ltd.) was then filled in the bottomed hole 14 for fixing the thermocouple in the bottome hole, whereby the hot plate 10 was obtained.

EXAMPLE 8

Example 8 was conducted in a manner similar to that of example 1, except that annealing was carried out for 3 hours at 1700° C. after the processing of the heating face by using a surface grinding machine (FIG. 9). The Ra value was 10 μm.

Sufficient glossiness of the surface was obtained as a result of annealing, in spite that polishing was not carried out.

COMPARATIVE EXAMPLE 4

Comparative example 4 was conducted in a manner similar to that of example 1, except that no yttria was added and neither CIP nor polishing was conducted after the processing of the heating face by using a surface grinding machine (FIG. 8). The Ra value was 10 μm.

COMPARATIVE EXAMPLE 5

Comparative example 5 was conducted in a manner similar to that of example 7, except that the sample was not subjected to annealing.

TEST EXAMPLE 1

The ceramic substrate of example 1 was polished and then subjected to annealing for 3 hours at 1600° C. The obtained sample of test example 1 had: the oxygen content of 1.6 weight %; the glossiness at the surface thereof of 220%; no pore; and the number of particles thereof was 40. However, the temperature evenness property at the wafer was deteriorated (6° C.). It is assumed that the temperature evenness property of the wafer was deteriorated because the surface of the ceramic substrate was so smooth that air can flow on the surface too easily, whereby air rather deprives heat of the heating face and thus decrease the temperature thereof.

For each of the ceramic substrates constituting the hot plates obtained by examples 1 to 8 and comparative examples 1 to 5, the oxygen content, the glossiness and the surface roughness and the average diameter of pore were obtained, respectively, according to the methods described below.

Further, each hot plate obtained by each of examples 1 to 8 and comparative examples 1 to 5 was fitted in a supporting case 30 having a shape shown in FIG. 3, through an insulating ring 35 made of a fluororesin and reinforced by glass fiber. The wires extending from the thermocouples were connected to an equipment for measurement, and the wires extending from the external terminals were connected to the power source. Thereafter, the hot plate was heated and the temperature evenness property of the silicon wafer was measured.

Evaluation Method (1) Measurement of the Average Diameter of Pore

The average diameter of pore was obtained by: preparing five samples and grinding the surface thereof into mirror planes; photographing the surface of each sample at ten sites by an electron microscope with 2000 magnification; and obtaining the average of the pore diameters of the photographed 50 shots.

(2) Evaluation of the Temperature Evenness Property of a Silicon Wafer

A silicon wafer was set on the hot plate, so that the silicon wafer was distanced by 100 μm from the heating face by the action of a lifter pin. Thereafter, the temperature of the hot plate was increased to 300° C., and the difference between the lowest temperature and the highest temperature at the silicon wafer was measured by using a thermoviewer (IR162012-0012, manufactured by Japan Datum Co., Ltd.). In example 7 and comparative example 5, the silicon wafer was set directly on the heating face. The result is shown in Table 1 as Temperature evenness property.

(3) Measurement of the Surface Glossiness

The glossiness of the substrate surface was measured at the angle of incidence and angle of reflection of each 60° by using a glossimeter (Glossmeter GM-3D type, manufactured by Murakami Shikisai Co., Ltd.), according to JIS K71055.2section. A glass surface having the refractive index of 1.567 was used as the reference plane.

(4) The Content of Oxygen

Each of samples which had been sintered in the same condition as applied to the sintered bodies of the above-mentioned examples and comparative examples was pulverized in a tungsten mortar. 0.01 g of each sample was collected and the oxygen content thereof was measured by using an oxygen/nitrogen simultaneous determinator (TC-136 type, manufactured by LECO Co., Ltd.,) at the sample-heating temperature of 2200° C. and the heating period of 30 seconds.

(5) Measurement of Ra (Surface Roughness)

The surface roughness of the ceramic substrate was measured by using a surface topography metrology system (P-11, made by KAL•Tencor Corporation) in the following conditions: the measured length being 50000 μm; the scanning rate being 50 μm/second; and the load being 3 mg.

The surface roughness Ra of the ceramic substrate of the present invention is defined according to JIS B 0601.

(6) Number of Particles

A silicon wafer was set on each of the hot plates and heated by the hot plate. Ten sites, which had been arbitrarily selected, of the silicon wafer were observed by using an electron microscope (with 2000 magnification) and photographed. For each shot, the number of particles whose diameter was 0.2 μm or larger was counted and the counted number was divided by the photographed field area.

TABLE 1

|  | Oxygen content (wt %) | Surface glossiness (%) | Surface roughness (μm) | Temperature evenness property of wafer (° C.) | Average diameter of pore (μm) | Number of particles (per cm²) |
|---|---|---|---|---|---|---|
| Example 1 | 1.6 | 165 | 0.02 | 4 | No pore | 30 |
| Example 2 | 1.6 | 50 | 0.2 | 4 | No pore | 50 |
| Example 3 | 1.6 | 50 | 0.2 | 4 | No pore | 50 |
| Example 4 | 1.6 | 2.8 | 0.5 | 5 | No pore | 75 |
| Example 5 | — | 5 | 0.5 | 15 | No pore | 60 |
| Example 6 | 1.6 | 100 | 0.1 | 4 | No pore | 35 |
| Example 7 | 0.6 | 30 | 0.1 | 5 | 0.1 | 60 |
| Example 8 | 1.6 | 20 | 10 | 4 | No pore | 50 |
| Comparative example 1 | 0.5 | 1.3 | 0.02 | 8 | No pore | 100 |
| Comparative example 2 | 1.6 | 1.0 | 2 | 8 | No pore | 100 |
| Comparative example 3 | — | 1.0 | 2 | 20 | No pore | 110 |
| Comparative example 4 | 0.5 | 1.1 | 10 | 9 | No pore | 120 |
| Comparative example 5 | 0.6 | 1.2 | 0.1 | 10 | 0.5 | 130 |

As is obvious from the above-mentioned Table 1, the hot plates according to examples 1 to 8 exhibited the surface glossiness of the heating face of 1.5% or more, whereby the flatness of the heating face thereof is enhanced and thus the silicon wafer can be evenly heated when the silicon wafer is heated. Further, in the hot plates according to examples 1 to 8, the number of particles is relatively small.

On the other hand, in the hot plates according to comparative examples 1 to 5, the surface glossiness of the heating face is less than 1.5% and does not exhibit satisfactory flatness, whereby, when the silicon wafer is heated, the silicon wafer cannot be heated evenly and the temperature evenness at the silicon wafer is increased to a significantly large range. Further, in the hot plates according to comparative examples 1 to 5, particles easily fall off by grinding, whereby the number of free particles increases.

In the hot plate according to comparative example 1, a significant number of particles which had fallen off was observed, although the hot plate had no pore.

As is understood from the comparison of comparative example 1 with example 1, a small value of the surface roughness (Ra) does not necessarily mean a high glossiness. Ra contains the information of depth of irregularities at a surface but does not contain the information of the density of irregularities at the surface. On the other hand, the glossiness presumably contains both the information of depth and the information of density of irregularities. Accordingly, the surface glossiness is regarded as more accurate information of a surface than Ra.

Further, a surface whose surface configuration has been made to have gentle-slope by annealing exhibits higher glossiness even if the Ra of the surface remains the same. Here, a surface having gentle-slope configuration means that the existence density of irregularities present at the surface is low. Thus, in a hot plate having a low density of irregularities on the heating face thereof, when a wafer is heated in a state that the wafer is distanced from the heating face, the air which has accumulated the heat is less likely to stagnate and thus the temperature evenness property of the wafer is improved. Further, in a hot plate having a low density of irregularities on the heating face thereof, when a wafer is heated in a state that the wafer is in direct contact with the heating face, the temperature evenness property of the wafer is also improved due to the increased contact area between the wafer and the heating face.

However, it is understood from the result of test example 1 that, in case that the surface glossiness exceeds 200%, the surface thereof is so smooth that air flows at the surface too easily when the wafer is heated in a state that the wafer is distanced from the heating face, whereby the temperature evenness property of the wafer rather deteriorates. Further, in the case that a surface whose surface glossiness exceeds 200%, it has the advantage that the contact area between the wafer and the heating face is increased when the wafer is heated in a state that the wafer is in direct contact with the heating face, however there may arise a problem that the impurities in the ceramic substrate is more likely to diffuse due to the increased contact area. Accordingly, it is assumed that the most preferable range of the surface glossiness of the ceramic substrate is 200% or less.

In the present invention, the ceramic hot plate made of nitride or carbide has achieved the temperature evenness confined within 2% of the pre-set temperature. Further, in the present invention, the ceramic hot plate made of oxide has achieved the temperature evenness confined within 5% of the pre-set temperature.

Industrial Applicability

As described above, in the hot plate of the present invention, the glossiness of the surface thereof is 1.5% or more and the depth of irregularities at the surface is small, whereby, when an object to be heated such as a silicon wafer is heated in a state that the object is distanced by a certain distance from the heating face, air does not stagnate between the silicon wafer and the heating face and thus the object to be heated can be evenly heated.

Further, in the hot plate of the present invention, when an object to be heated such as a silicon wafer is heated in a state that the object is in close contact with the heating face, the object is brought into surface-contact with the heating face because the heating face is excellently flat, whereby the object to be heated can be evenly heated.

Yet further, the ceramic substrate having glossiness as described above exhibits excellent sintering property and a high density of the sintered body. In other words, grains constituting the sintered body are firmly bound to each other. Accordingly, grains hardly fall off by grinding and thus generation of free particles which have fallen off from the substrate can be substantially prevented.

What is claimed is:

1. A hot plate for a semiconductor producing/examining device, comprising a resistance heating element formed on a surface of a ceramic substrate or inside the ceramic substrate, wherein glossiness of a heating face of said ceramic substrate is 1.5% or more.

2. The hot plate for a semiconductor producing/examining device according to claim 1, wherein said ceramic substrate contains 0.5 to 10 weight % of oxygen.

3. The hot plate for a semiconductor producing/examining device according to claim 1, wherein said ceramic substrate is subjected to an annealing treatment.

4. The hot plate for a semiconductor producing/examining device according to claim 1, wherein said ceramic substrate is subjected to a cold isostatic pressing process before it is sintered.

5. The hot plate for a semiconductor producing/examining device according to claim 2, wherein said ceramic substrate is subjected to an annealing treatment.

6. The hot plate for a semiconductor producing/examining device according to claim 2, wherein said ceramic substrate is subjected to a cold isostatic pressing process before it is sintered.

7. The hot plate for a semiconductor producing/examining device according to claim 3, wherein said ceramic substrate is subjected to a cold isostatic pressing process before it is sintered.

8. The hot plate for a semiconductor producing/examining device according to claim 5, wherein said ceramic substrate is subjected to a cold isostatic pressing process before it is sintered.

9. The hot plate for a semiconductor producing/examining device according to claim 1, wherein said ceramic substrate has a diameter of 200 mm or more.

10. The hot plate for a semiconductor producing/examining device according to claim 1, wherein said ceramic substrate is a non-oxide type ceramic.

11. The hot plate for a semiconductor producing/examining device according to claim 1, wherein said ceramic substrate contains a sintering aid.

12. The hot plate for a semiconductor producing/examining device according to claim 1, wherein a silicon wafer is distanced from said ceramic substrate and heated.

13. The hot plate for a semiconductor producing/examining device according to claim 1, wherein the glossiness of the heating face of said ceramic substrate is 2.8% to 165%.

14. A hot plate comprising:

a ceramic substrate having a heating face which is configured to face a work to be heated, the heating face having glossiness of at least 1.5%; and a resistance heating element provided on or in the ceramic substrate.

* * * * *